United States Patent
Smith et al.

(10) Patent No.: US 6,219,278 B1
(45) Date of Patent: Apr. 17, 2001

(54) SENSE AMPLIFIER FOR MEMORY

(75) Inventors: Malcolm Harold Smith, Macungie; Ross Alan Kohler, Allentown, both of PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/314,741

(22) Filed: May 19, 1999

(51) Int. Cl.[7] .................................................. G11C 16/06
(52) U.S. Cl. ...................................... 365/185.21; 365/196
(58) Field of Search ............................. 365/185.21, 196, 365/195, 189.04

(56) References Cited

U.S. PATENT DOCUMENTS

| | | | |
|---|---|---|---|
| 4,041,327 | * 8/1977 | Thomas | 307/231 |
| 5,394,037 | * 2/1995 | Josephson et al. | 327/51 |
| 5,408,148 | * 4/1995 | Pascucci et al. | 327/52 |

* cited by examiner

Primary Examiner—David Nelms
Assistant Examiner—Thong Le
(74) Attorney, Agent, or Firm—Jean-Marc Zimmerman

(57) ABSTRACT

An improved sense amplifier for accessing data stored in a flash memory or other memory, wherein the improvement consists of adding a variable impedance switch transistor to a conventional sense amplifier having a fixed impedance. The switch transistor has a low impedance for fast settling of charge during the pre-charge state of the flash memory, and has a high impedance during the sensing state of the flash memory for achieving a high gain and thus faster access of stored data than conventional sense amplifiers. The present invention also provides for better matching of sense amplifier transistors, thereby decreasing variations in performance between different transistors.

22 Claims, 2 Drawing Sheets

SENSE AMPLIFIER FOR MEMORY

FIELD OF THE INVENTION

The present invention relates to the field of amplifiers, and more particularly to an improved sense amplifier for a memory.

BACKGROUND OF THE INVENTION

Flash memory is a semiconductor type of non-volatile memory that does not lose its stored data when its power is turned off. Flash memory is both electronically programmable and erasable, thereby enabling it to be reprogrammed even after it has been wired into an electronic system. Flash memory is used in numerous applications including storing microprocessor programs that control the operation of electronic devices such as cell phones and pagers.

Conventional flash memory is typically comprised of an array of memory cells. Information can be stored in a flash memory cell as a charge on a floating gate of a transistor comprising the cell, or as a charge trapped in a dielectric layer of semiconductor material from which the cell is fabricated. Data stored in a flash memory cell is typically read, i.e., sensed, by increasing the control gate voltage of the memory cell on a common word-line, and then sensing whether current is flowing through the memory cell at the bit-line to which the drain terminal of the memory cell is coupled. The circuit used to sense stored data is called a sense amplifier because it amplifies a small change in the bit-line voltage during the first moments of a read into a full logic voltage swing.

Conventional flash memory operates in two stages: a pre-charge stage requiring low impedance so that a previous read can settle quickly and the memory can prepare for the next read, and a sense stage requiring high impedance in order to achieve a high gain during the read in order to access the stored data as quickly as possible. However, conventional sense amplifiers suffer from a significant drawback. Specifically, they typically have a single fixed impedance value unable to provide both the low and high impedance required for optimum performance.

A related U.S. patent application for a Switched Resistor for Sensing Low Current was filed by the applicant Malcolm Smith on Sep. 25, 1998 and has been assigned application Ser. No. 09/160,411.

SUMMARY

An improved sense amplifier for a flash memory having a low impedance state for fast settling of charge in the pre-charge stage of the operation of the flash memory, and a high impedance state for achieving a high gain and thus faster access to stored data during the sense stage operation of the flash memory than conventional sense amplifiers.

DETAILED DESCRIPTION OF THE INVENTION

Figure 1:
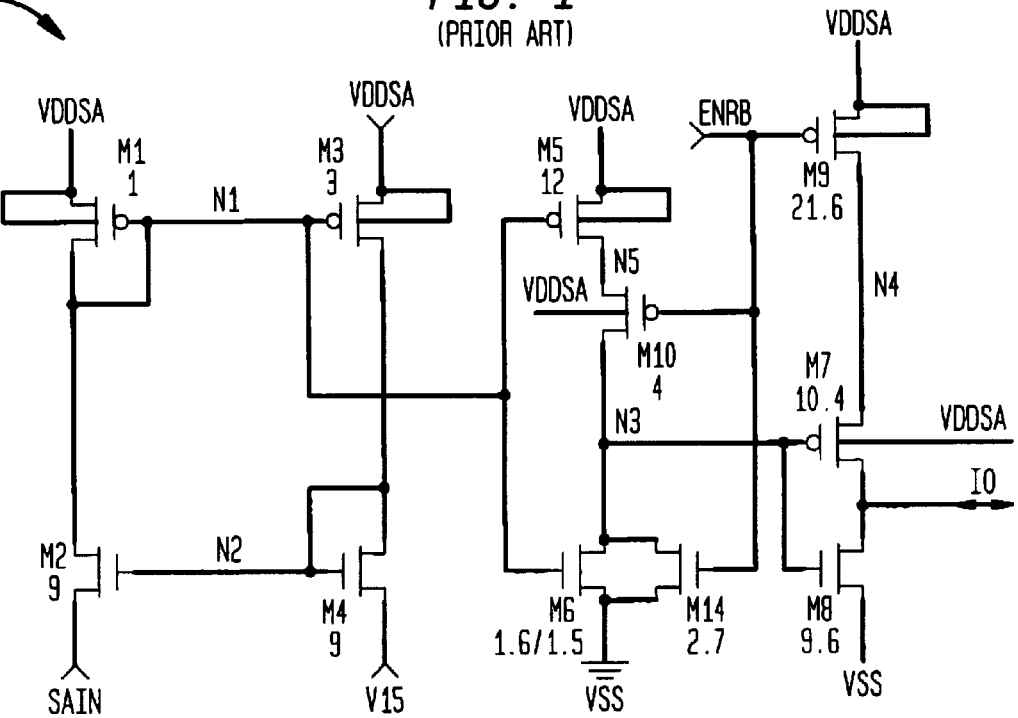
FIG. 1 shows a conventional sense amplifier circuit.

FIG. 1 shows a prior art sense-amplifier circuit 10 used in a conventional flash memory, wherein an array of memory cells is attached to node SAIN. Transistors M1–M4 comprise a front end of circuit 10 and act as a pre-amplifier for the rest of circuit 10. Since the present invention incorporates circuit 10, a detailed review of its operation will aid in understanding the teachings of the present invention. If during the sense stage operation of the flash memory, the memory cell being read is not conducting, then no current flows from the memory cell into circuit 10 through transistor M2. Circuit 10 is thus effectively an open circuit such that the nodal voltage at node N1 is pulled up by transistor M1 causing both transistors M1 and M3 to turn off since they are current mirrors.

As the nodal voltage of node N1 is pulled up, transistor M5 turns off while transistor M6, whose gate is coupled to node N1, turns on, thereby pulling the nodal voltage of node N3 down towards ground. As a result, transistor M7 turns on and transistor M8 turns off, thereby pulling the output of circuit 10 higher.

By contrast, if during the sense stage operation of the flash memory, the memory cell being read is conducting, then current flows from the memory cell into circuit 10 through transistor M2. As a result, the voltage at node SAIN, which is initially high and at the same voltage as V15, is pulled down towards ground such that the nodal voltage at node N1 is also pulled down towards ground causing transistors M1 and M3 to both turn on harder. In response, transistor M4 turns on harder which causes transistor M2 to turn on harder increasing the pull on transistor M1 to turn on harder, thereby creating positive feedback around the front end of circuit 10 for turning transistors M1–M4 on harder. As the nodal voltage of node N1 is pulled down towards ground, transistor M5 turns on harder and transistor M6 turns off so that the nodal voltage of node N3 is pulled up higher away from ground causing transistor M7 to turn off and transistor M8 to turn on, thereby pulling the output of circuit 10 low.

Circuit 10 suffers from a significant drawback. Specifically, having an impedance of fixed value limits the gain the sense amplifier can achieve and thus the speed at which it attains the threshold voltage required to switch from the pre-charge stage to the sense stage since the switching speed is directly proportional to the gain. The gate of transistor M1 is diode connected to its drain such that the signal impedance seen looking into node N1 from transistor M2 is relatively small because the transconductance, which is the inverse of the impedance, is relatively large compared to the other conductances, e.g., at the drain of transistor M1. Consequently, even though the nodal voltage at node N1 settles quickly to its pre-charged value, the gain of circuit 10 is small and thus circuit 10 switches slowly.

Figure 2:
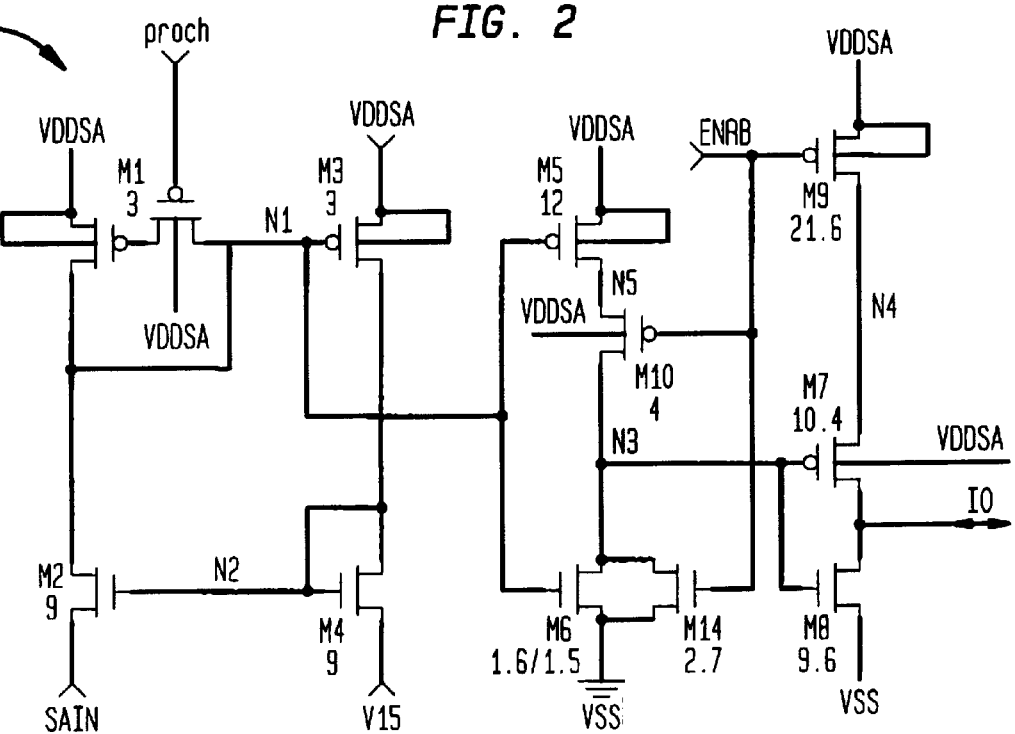
FIG. 2 shows an exemplary embodiment of an improved sense amplifier circuit according to the present invention.

FIG. 2 shows an exemplary embodiment of a sense amplifier circuit 20 according to the present invention which overcomes the foregoing drawback by adding a variable resistance switch transistor M15 to circuit 10, thereby enabling circuit 20 to have a low impedance in the pre-charge stage and a high impedance in the sense stage. Circuit 20 utilizes the conventional front end of circuit 10 in the pre-charge stage in which it has a low impedance and thus enables quick settling of the memory cell, but it also eliminates the connection between the gate of transistor M1 to node N1 in the sense stage, thereby providing the desired high impedance for a quick switching speed.

During the pre-charge stage, switch transistor M15 switches closed to an on state such that the voltage at node prech is pulled down towards ground causing transistor M15 to turn on more quickly. Consequently, since the gate of transistor M1 is connected to the drain of transistor M1, the impedance seen looking into the drain of transistor M1 is small, thereby ensuring quick settling of node N1.

During the sense stage, switch transistor M15 switches open to an off state such that the voltage at node prech is pulled up from ground causing transistor M15 to turn off. Consequently, since the gate of transistor M1 is no longer connected to its drain, the impedance seen looking into the drain of transistor M1 is large so that the preamplifier gain is large such that the threshold voltage is more quickly attained to switch the circuit more quickly.

Transistor M15 can be any conventional type of transistor having transconductance and conductance. The back end of circuit 20 operates in the same manner as the back end of circuit 10 described above. The addition of switch transistor M15 without any other performance enhancements enables circuit 20 to access data from a memory cell faster than can circuit 10. Circuit 20 has several additional benefits compared to circuit 10. Typically, the only way to improve the speed of conventional sense amplifiers like circuit 10 is to decrease the width of transistors M1 and M3 so that their transconductance decreases. However, doing so worsens the match between transistors M1, M3 and M5, and thus results in large differences in performance of the various components of circuit 10. By contrast, adding switch transistor M15 enables the widths of transistors M1 and M3 to be increased so that they match better, thereby improving both pre-charge settling and sense stage switching, while also decreasing variations in performance of the various components of circuit 20.

Figure 3:
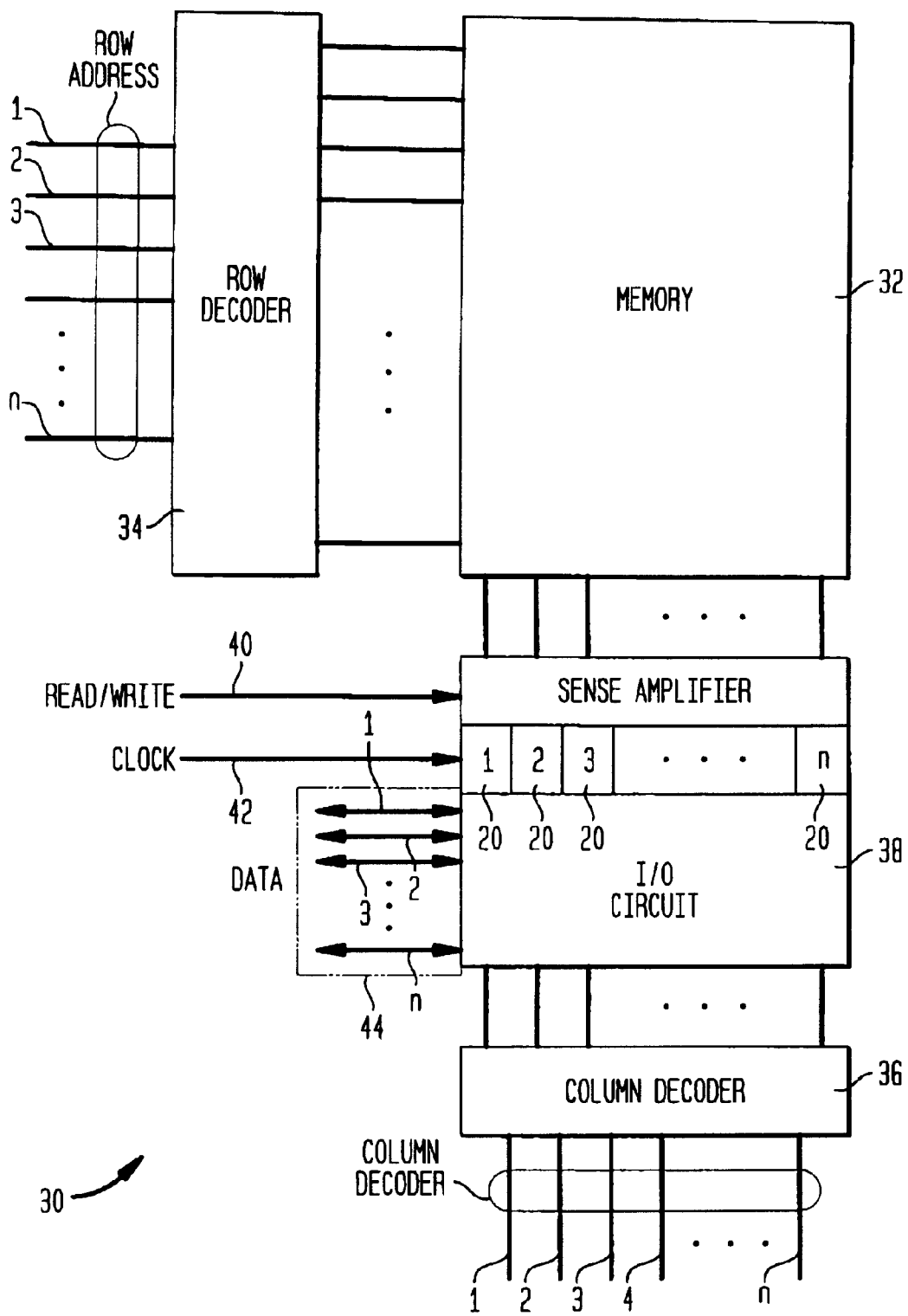
FIG. 3 shows a block diagram of a conventional memory circuit in which a plurality of sense amplifier circuits according to the present invention are used.

Conventional memory circuits typically include a plurality of sense amplifiers for reading data from the memory. FIG. 3 shows a block diagram of a conventional memory circuit 30 having a plurality of sense amplifier circuits 20. Memory circuit 30 is comprised of a memory 32 to which is coupled a row decoder 34 for a plurality of row addresses 1 through n, and a column decoder 36 for a plurality of column addresses 1 through n. Interposed between memory 32 and column decoder 36 is an in/out circuit 38 having a read/write line 40, a clock line 42, a plurality of data lines 44, numbered 1 through n, and a plurality of sense amplifier circuits 20, numbered 1 through n, for reading data from memory 32.

The present invention may be used in any integrated circuit such as a memory, or any integrated circuit having an embedded memory. The invention may also be used with various types of memory, including but not limited to EPROM, SRAM, DRAM and ROM.

Numerous modifications to and alternative embodiments of the present invention will be apparent to those skilled in the art in view of the foregoing description. Accordingly, this description is to be construed as illustrative only and is for the purpose of teaching those skilled in the art the best mode of carrying out the invention. Details of the structure maybe varied substantially without departing from the spirit of the invention and the exclusive use of all the modifications, which come within the scope of the appended claims, is reserved.

What is claimed is:

1. An improved sense amplifier circuit for a memory, comprising:
   a plurality of transistors coupled together, wherein a first one of the transistors is coupled to at least one memory cell, a second one of the transistors is coupled to the first one of the transistors, and a third one of the transistors is coupled to the second one of the transistors, the third one of the transistors being a variable impedance transistor configured to alternatively be in a low impedance state and a high impedance state, thereby enabling the improved sense amplifier circuit to read data from the at least one memory cell more quickly than a conventional sense amplifier circuit having a fixed impedance value.

2. The improved sense amplifier circuit according to claim 1, wherein the variable impedance transistor is in the low impedance state when the improved sense amplifier circuit does not read data from the at least one memory cell.

3. The improved sense amplifier circuit according to claim 2, wherein the variable impedance transistor is in the low impedance state during a pre-charge stage of operation of the at least one memory cell.

4. The improved sense amplifier circuit according to claim 1, wherein the variable impedance transistor is in the high impedance state when the improved sense amplifier circuit reads data from the at least one memory cell.

5. The improved sense amplifier circuit according to claim 4, wherein the variable impedance transistor is in the high impedance state during a sense stage of operation of the at least one memory cell.

6. The improved sense amplifier according to claim 1, wherein the second one of the transistors includes a gate and a drain, and wherein the gate is tied to the drain through the third one of the transistors.

7. The improved sense amplifier according to claim 6, wherein the third one of the transistors is a switch transistor.

8. The improved sense amplifier circuit according to claim 7, wherein the switch transistor is closed when not reading data from the at least one memory cell.

9. The improved sense amplifier circuit according to claim 7, wherein the switch transistor is open when reading data from the at least one memory cell.

10. The improved sense amplifier circuit according to claim 1, further comprising a fourth one of the transistors, wherein the fourth one of the transistors is coupled to the variable impedance transistor, and wherein the variable impedance transistor enables the width of both the second and fourth ones of the transistors to be increased, thereby improving the match between the second and fourth ones of the transistors and increasing the speed at which the improved sense amplifier circuit can read data from the memory.

11. An improved sense amplifier circuit for a memory, comprising:
    a plurality of transistors and a variable impedance element coupled together, wherein a first one of the transistors is coupled to a memory, a second one of the transistors is coupled to the first one of the transistors, and the variable impedance element is coupled to the second one of the transistors, the variable impedance element having a low impedance during a first stage of operation of the memory and a high impedance during a second stage of operation of the memory, wherein the variable impedance element increases the speed at which data is sensed from the memory.

12. The improved sense amplifier circuit according to claim 11, wherein the variable impedance element has the low impedance for fast settling of the memory during a pre-charge stage of operation of the memory, and has the high impedance during a sense stage of operation of the memory when stored data is sensed from the memory.

13. The improved sense amplifier according to claim 12, wherein the second transistor has a gate and a drain, and wherein the gate is tied to the drain through the variable resistance element.

14. The improved sense amplifier circuit according to claim 12, wherein the variable impedance element is a switch transistor.

15. The improved sense amplifier circuit according to claim 14, wherein the switch transistor is closed when data is not being sensed from the memory.

16. The improved sense amplifier circuit according to claim 14, wherein the switch transistor is open when data is being sensed from the memory.

17. The improved sense amplifier circuit according to claim 11, further comprising a third one of the transistors, wherein the third one of the transistors is coupled to the variable impedance element, and wherein the variable impedance element enables the width of both the second and third ones of the transistors to be increased, thereby improving the match between the second and third ones of the transistors and increasing the speed at which the improved sense amplifier circuit can sense data from the memory.

18. An improved sense amplifier for a memory, comprising:

a first transistor and a switch transistor coupled together, wherein a combination of the first transistor and the switch transistor is configured to alternatively switch between a low impedance state and a high impedance state, thereby enabling the improved sense amplifier to access stored data from a memory more quickly than a sense amplifier having a fixed impedance.

19. The improved sense amplifier according to claim 18, wherein the combination of the first transistor and the switch transistor has the low impedance state for fast settling of the memory during a pre-charge stage of operation of the memory, and has the high impedance state when sensing data stored in the memory during a sensing stage of operation of the memory.

20. A method for increasing the speed at which a sense amplifier circuit accesses data from a memory, comprising the steps of:

adding a variable resistance element to a sense amplifier circuit having a fixed impedance.

21. An integrated circuit, comprising:

at least one sense amplifier for a memory, wherein the at least one sense amplifier includes a first transistor coupled to at least one memory cell, a second transistor coupled to the first transistor, and a third transistor coupled to the second transistor, the third transistor being a variable impedance transistor configured to alternatively be in a low impedance state and a high impedance state, thereby enabling the integrated circuit to read data from the at least one memory cell more quickly than an integrated circuit having a fixed impedance value.

22. An integrated circuit having a plurality of sense amplifiers for a memory, each sense amplifier comprising:

a plurality of transistors coupled together, wherein a first one of the transistors is coupled to at least one memory cell, a second one of the transistors is coupled to the first one of the transistors, and a third one of the transistors is coupled to the second one of the transistors, the third one of the transistors being a variable impedance transistor configured to alternatively be in a low impedance state and a high impedance state, thereby enabling the integrated circuit to read data from the at least one memory cell more quickly than an integrated circuit having a fixed impedance value.

* * * * *